United States Patent
Miyoshi et al.

(10) Patent No.: US 6,235,981 B1
(45) Date of Patent: May 22, 2001

(54) P-TYPE THERMOELECTRIC CONVERTING SUBSTANCE AND METHOD OF MANUFACTURING THE SAME

(75) Inventors: Makoto Miyoshi; Yuichiro Imanishi, both of Nagoya; Keiko Kushibiki, Fujisawa; Masakazu Kobayashi, Yokosuka; Kenji Furuya; Kazuhiko Shinohara, both of Yokohama, all of (JP)

(73) Assignees: NGK Insulators, Ltd., Nagoya; Nissan Motor Co., Ltd., Yokohama, both of (JP)

( * ) Notice: Subject to any disclaimer, the term of this patent is extended or adjusted under 35 U.S.C. 154(b) by 0 days.

(21) Appl. No.: 09/270,102

(22) Filed: Mar. 16, 1999

(30) Foreign Application Priority Data

Mar. 16, 1998 (JP) .................................. 10-065298

(51) Int. Cl.[7] .................................... H01L 35/34

(52) U.S. Cl. .................. 136/201; 136/236.1; 136/239; 136/240

(58) Field of Search .................... 136/201, 239, 136/240, 236.1

(56) References Cited

U.S. PATENT DOCUMENTS

| | | | |
|---|---|---|---|
| 5,610,366 | 3/1997 | Fleurial et al. | 136/202 |
| 5,912,429 | * 6/1999 | Imanishi et al. | 136/240 |
| 5,965,841 | * 10/1999 | Imanishi et al. | 136/201 |

FOREIGN PATENT DOCUMENTS

| | | |
|---|---|---|
| 0797259 | 9/1997 | (EP) . |
| 0797260 | 9/1997 | (EP) . |

OTHER PUBLICATIONS

L. D. Dudkin et al., "On the Doping of the Semiconductor Compound CoSb3," (1959), pp. 126–133. No Month Given.
"Thermoelectric Properties of (Pd, Co)Sb$_3$ Compounds with Skutterudite Structure"; K. Matsubara et al.; Department of Electrical and Electronic Engineering, Yamaguchi University, Japan; pp. 226–229; 1995; American Institute of Physics. No Month Given.
L.D. Dudkin et al., "On The Doping of the Semiconductor Compound CoSb," Soviet Physics Solid State, 1959, pp. 126–133. No Month Given.
Patent Abstracts of Japan, vol. 1996, No. 11, Nov. 29, 1996, JP 8–186294.
Patent Abstracts of Japan, vol. 1997, No. 07, Jul. 31, 1997, JP 9–064422.
Patent Abstracts of Japan, vol. 1998, No. 09, Jul. 31, 1997, JP 10–102160.

* cited by examiner

*Primary Examiner*—Kathryn Gorgos
*Assistant Examiner*—Thomas H. Parsons
(74) *Attorney, Agent, or Firm*—Parkhurst & Wendel, L.L.P.

(57) ABSTRACT

A p-type thermoelectric converting substance used as a p-type semiconductor in a thermoelectric converting module consisting essentially of a substance expressed by a chemical formula $CoSb_xSn_y$ or $CoSb_xGe_y$ ($2.7<x<3.4$, $0<y<0.4$, $x+y>3$), and containing a small amount of oxygen z defined by $2(x+y-3) \geq z$. The amount of oxygen z is preferably limited such that it is not higher than 0.1 molecules per 1 molecule of Co. An alloy ingot consisting essentially of $CoSb_xSn_y$ or $CoSb_xGe_y$ ($2.7<x<3.4$, $0<y<0.4$, $x+y>3$) is ground to obtain a raw material powder. Then, the powder is cast into a mold, and the mold is sintered under a non-oxidizing or reducing atmosphere. The thus obtained substance reveals p-conductivity in a stable manner over a wide temperature range, and has excellent thermoelectric converting properties.

27 Claims, 6 Drawing Sheets

P-TYPE THERMOELECTRIC CONVERTING SUBSTANCE AND METHOD OF MANUFACTURING THE SAME

BACKGROUND OF THE INVENTION

1. Field of the Invention

The present invention relates to a p-type semiconductor substance having a thermoelectric converting property for use in a thermoelectric converting module, and more particularly to a p-type thermoelectric converting substance mainly consisting of a substance represented by a chemical formula of $CoSb_3$ and a small amount of Sn or Ge serving as an additive for controlling the conductivity of the substance to p-type. The present invention also relates to a method of manufacturing such a thermoelectric converting substance.

2. Description of the Related Art

Heretofore, there have been proposed telluric compound such as $Bi_2Te_3$, $Bi_2Sb_8Te_{15}$ and $BiTe_2Se$ as a thermoelectric converting substance. Among antimony compounds generally expressed as $TSb_3$(T: Co, Ir, Ru), $CoSb_3$ has been known as the thermoelectric converting substance. $CoSb_3$ thermoelectric converting substance can be used in a temperature range up to about 600° C.

The above mentioned telluric compounds generally expressed by Bi-Te have a relatively high performance index Z of about $3 \times 10^{-3}$ [1/k] at room temperature, but the performance index is decreased in a temperature range higher than 300° C. Furthermore, the thermoelectric converting substance mainly consisting of the above mentioned telluric compound has a low melting point and a poor chemical stability, and moreover its thermoelectric converting property might be largely varied depending upon a deviation in composition.

Among the Sb base compounds expressed by $TSb_3$(T: Co, Ir, Ru), $CoSb_3$ can operate satisfactorily over a much wider temperature range than Bi—Ti series compounds. Such thermoelectric converting compound semiconductor $CoSb_3$ has been described in L. D. Dudkin and N. Kh. Abrikosov, Sov. Phys. Solid State, 1(1959), pp. 126–133. In such a compound semiconductor, however, there is a problem in obtaining a thermoelectric converting substance having a p-type conductivity. That is to say, stoichiometric $CoSb_3$ having no additive shows p-conductivity type, but when an additive is not added, the conductivity of the substance could not be controlled due to the influence of non-purity of raw materials and it is difficult to attain a stable thermoelectric converting property. Moreover, the control of the conductivity type could not be performed effectively.

In addition to the problem of the non-purity of raw materials, there is a problem in that the composition of the substance is inevitably changed during the manufacturing process. Particularly, when a lack of Sb occurs in the stoichiometric composition, the conductivity type might be inverted and the finally obtained thermoelectric converting substance becomes n-type.

Due to the above explained reasons, in order to obtain p-type $CoSb_3$ showing high and stable thermoelectric conversion properties, it is necessary to dope a raw material of $CoSb_3$ with impurities controlling the conductivity type to the p-type, and further it is also necessary to remove the variation in composition during the manufacturing process.

SUMMARY OF THE INVENTION

The present invention has for its object to provide a novel and useful p-type thermoelectric converting substance mainly consisting of $CoSb_3$, which can remove or at least mitigate the above mentioned drawbacks of the known substance, has a higher performance over a wide temperature range, has a higher electric conductivity, has a chemical stability, and has a small variation in chemical composition.

According to a first aspect of the invention, a thermoelectric converting substance used as a p-type semiconductor in a thermoelectric converting module is mainly consisting of a substance expressed by a chemical formula of $CoSb_xSn_y$ (2.7<x<3.4, 0<y<0.4, x+y>3), and contains an oxygen by an amount z of $2(x+y-3) \geq z$.

According to a second aspect of the invention, a thermoelectric converting substance used as a p-type semiconductor in a thermoelectric converting module is mainly consisting of a substance expressed by a chemical formula of $CoSb_xGe_y$ (2.7<x<3.4, 0<y<0.4, x+y>3), and contains an oxygen by an amount z of $2(x+y-3) \geq z$.

In the above mentioned p-type thermoelectric converting substance according to the invention, it is preferable to limit said amount of oxygen z such that an amount of the oxygen is not higher than 0.1 molecules per 1 molecule of Co in order to improve the electrical conductivity. That is to say, a molecular ratio of O/Co is preferably set to be equal to or smaller than 0.1.

Further, according to the invention, the p-type thermoelectric substance may be preferably formed by a sintered body which can be easily and efficiently manufactured by a typical sintering process.

In the p-type thermoelectric converting substance according to the invention, the substance is essentially consisting of $CoSb_xSn_y$ (2.7<x<3.4, 0<y<0.4, x+y>3) or $CoSb_xGe_y$ (2.7<x<3.4, 0<y<0.4, x+y>3) and an amount of oxygen z is limited to $2(x+y-3) \geq z$. If an amount of oxygen z is higher than 2(x+y-3), Sn or Ge serving as a dopant for controlling the conductivity type into p-type, i.e. acceptor is selectively oxidized and the substance could no more show the p-type conductivity stably. That is to say, although the compound semiconductor $CoSb_3$ deviating from stoichiometry shows the n-type conductivity due to a lack of antimony Sb, when impurities Sn or Ge serving as dopant are introduced into lattice defect sites, the substance shows the p-type conductivity. If an amount of oxygen z is higher that 2(x+y-3), the dopant is oxidized to produce $SnO_2$ or $GeO_2$ and such oxidized dopant could not enter into the defect sites, and thus the substance could no more reveal the p-type conductivity.

Furthermore, according to the invention, an amount of Sb is limited to 2.7<x<3.4, an amount of Sn or Ge is limited to 0<y<0.4, and a sum of these amounts is set to be larger than 3 (x+y>3). If amounts of Sb and Sn deviate from these ranges, the electrical conductivity and Seebeck coefficient might be lowered and the substance could not have a good performance as the p-type semiconductor for the thermoelectric conversion module.

The present invention also relates to a method of manufacturing the above mentioned p-type thermoelectric converting substance.

According to the invention, a method of manufacturing a p-type thermoelectric converting substance comprises the steps of:

preparing a raw material powder mainly consisting of a substance expressed by a chemical formula of $CoSb_x$-$Sn_y$, or $CoSb_xGe_y$ (2.7<x<3.4, 0<y<0.4, x+y>3), in which Sn or Ge serves as a dopant for controlling the p-type conductivity;

casting said raw material powder into a mold having a given shape; and sintering said mold under a reducing atmosphere.

In the method according to the invention, said sintering may be preferably carried out under a hydrogen atmosphere.

According to further aspect of the invention, a method of manufacturing a p-type thermoelectric converting substance comprises the steps of:

preparing a raw material powder mainly consisting of a substance expressed by a chemical formula of $CoSb_x$-$Sn_y$, or $CoSb_xGe_y$ (2.7<x<3.4, 0<y<0.4, x+y>3) and containing an oxygen by an amount z of $2(x+y-3) \geq z$, Sn or Ge serving as a dopant for controlling the p-type conductivity;

casting said raw material powder into a mold having a given shape; and sintering said mold under a non-oxidizing atmosphere.

In such a method according to the invention, said sintering may be carried out under an inert gas atmosphere such as nitrogen and argon atmosphere. Furthermore, said sintering may be carried out under a reducing atmosphere such as a hydrogen atmosphere. It is also possible to perform the sintering in high vacuum.

In the method of manufacturing the p-type thermoelectric converting substance according to the invention, in order to limit an amount of an oxygen in the finally obtained substance, the raw material powder containing a smaller amount of oxygen is sintered in the non-oxidizing atmosphere or the raw material powder is sintered in a reducing atmosphere to reduce an amount of oxygen during the manufacturing process. Then, undesired oxidation of Sn or Ge serving as a dopant is limited, and a control of dopant can be performed precisely and stably. In this manner, according to the invention, it is possible to manufacture the p-type thermoelectric converting substance having excellent thermoelectric converting properties in an efficient and stable manner.

In the above mentioned method according to the invention, said raw material powder may be preferably prepared by mixing given amounts of Co, Sb and Sn particles, melting the particles to obtain an alloy ingot, and grinding the alloy ingot into said raw material powder. Further, said alloy ingot may be preferably ground such that an average diameter of the raw material powder is smaller than 100 μm. Moreover, said sintering may be preferably carried out at a temperature in a range of 600–800° C.

DESCRIPTION OF THE PREFERRED EMBODIMENT

Figure 1:
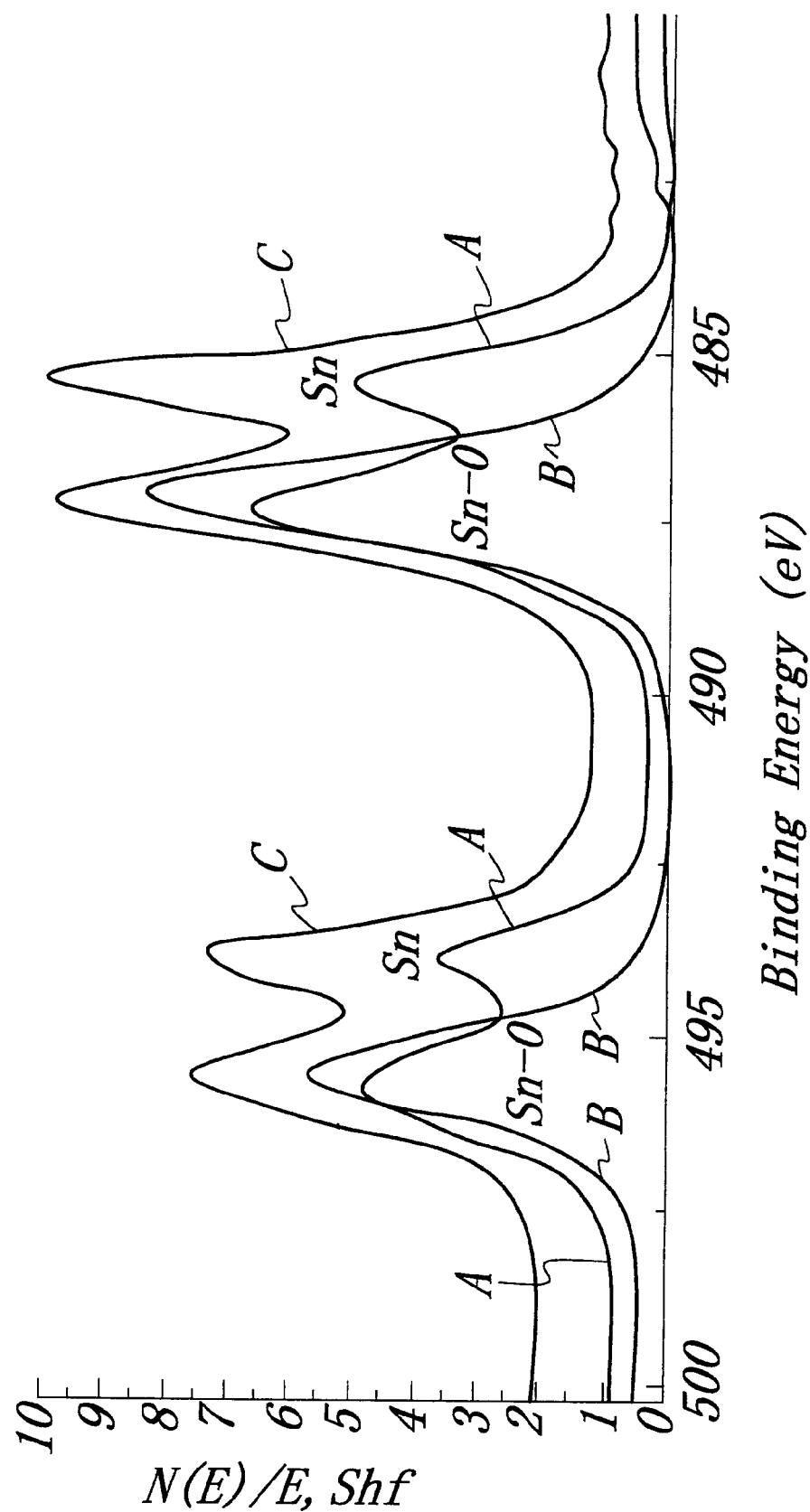
FIG. 1 is a graph of the X-ray photoelectron spectrum representing chemical bonding condition of Sn in examples of the p-type thermoelectric converting substance according to the invention and in a comparative example.

Now several examples of the p-type thermoelectric converting substance according to the invention will be explained together with comparative examples. It should be noted that these examples are manufactured by the following process.

These samples are manufactured in the following manner. Particulate Co, Sb and Sn are prepared as starting materials. Given amounts of these particles are taken out by means of a weighing machine and are mixed, and then they are melted by an arc melting machine. After cooling a melt to obtain an alloy ingot, the alloy ingot is roughly ground in a mortar, and then is subjected to a dry powdering by means of a planetary rotating bowl mill. In this manner, a raw material powder having an average diameter smaller than 100 μm is obtained. Then, the alloy powder thus obtained is cast into a desired shape under a pressure of 7 Ton/cm² to form a mold, and finally the thus obtained mold is heated or sintered at a temperature in a range of 600–800° C. for 48 hours under a nitrogen gas atmosphere (non-oxidizing atmosphere) or a hydrogen gas atmosphere (reducing atmosphere) to obtain a final thermoelectric converting substance.

The above mentioned thermoelectric converting substance contains Sn as a dopant for controlling the conductivity type to p-type, and the thermoelectric converting substance containing Ge may be equally manufactured by the above mentioned process.

According to the invention, the raw material powder may be prepared by mixing powders of respective materials with such a ratio that a desired composition ratio can be obtained. Alternatively, after forming an alloy ingot of two kinds of raw materials, the ingot is powdered, and the thus obtained powder is mixed with a powder of a remaining raw material such that a desired composition ratio can be attained. Table 1 represents composition of raw material powder, composition of sintered body, sintering temperature and sintering atmosphere of various samples. It should be noted that in this table I, the composition is expressed on the basis of a unit amount of Co. Samples 1–7 and 16–18 are embodiments of the thermoelectric converting substance according to the invention, and samples 8–15 are comparative examples.

TABLE 1

| | Sample No. | Powder | | | Sintered body | | | Sintering temperature (° C.) | Atmosphere |
|---|---|---|---|---|---|---|---|---|---|
| | | Sb | Sn | O | Sb | Sn | O | | |
| Embodiment | 1 | 3.42 | 0.08 | 0.04 | 3.40 | 0.08 | 0.04 | 650 | $N_2$ |
| | 2 | 3.32 | 0.08 | 0.09 | 3.25 | 0.08 | 0.07 | 650 | $N_2$ |
| | 3 | 3.10 | 0.08 | 0.20 | 3.10 | 0.08 | 0.18 | 650 | $N_2$ |
| | 4 | 3.12 | 0.08 | 0.22 | 3.13 | 0.08 | 0.21 | 650 | $N_2$ |
| | 5 | 3.30 | 0.08 | 0.24 | 3.28 | 0.08 | 0.23 | 750 | $N_2$ |
| | 6 | 3.31 | 0.08 | 0.23 | 3.30 | 0.08 | 0.22 | 800 | $N_2$ |
| | 7 | 3.23 | 0.06 | 0.21 | 3.20 | 0.06 | 0.19 | 650 | $N_2$ |
| Comparative Example | 8 | 3.12 | 0.03 | 0.36 | 3.11 | 0.04 | 0.34 | 650 | $N_2$ |
| | 9 | 3.17 | 0.02 | 0.38 | 3.16 | 0.02 | 0.35 | 650 | $N_2$ |
| | 10 | 3.06 | 0.07 | 0.30 | 3.06 | 0.06 | 0.29 | 650 | $N_2$ |
| | 11 | 3.06 | 0.03 | 0.22 | 3.06 | 0.04 | 0.22 | 650 | $N_2$ |
| | 12 | 3.08 | 0.03 | 0.24 | 3.07 | 0.03 | 0.24 | 650 | $N_2$ |
| | 13 | 3.05 | 0.01 | 0.18 | 3.04 | 0.01 | 0.16 | 650 | $N_2$ |
| | 14 | 2.95 | 0.02 | 0.16 | 2.96 | 0.02 | 0.15 | 650 | $N_2$ |
| | 15 | 2.98 | 0.05 | 0.18 | 2.99 | 0.05 | 0.17 | 650 | $N_2$ |
| Embodiment | 16 | same as sample 4 | | | 3.14 | 0.08 | 0.04 | 650 | $H_2$ |
| | 17 | same as sample 10 | | | 3.07 | 0.05 | 0.03 | 700 | $H_2$ |
| | 18 | same as sample 14 | | | 2.98 | 0.06 | 0.03 | 750 | $H_2$ |

As can be understood from the table 1, in the reducing atmosphere as well as in the non-oxidizing atmosphere, an amount of oxygen contained in sintered bodies is lowered materially as compared to that in raw material powders prior to the sintering. This is due to a fact that when the raw material powder is sintered in the non-oxidizing atmosphere, no oxygen is newly introduced and a certain amount of oxygen adhered to the surface of sintered body is removed during the sintering. An amount of oxygen adhered onto the surface of sintered body is dependent upon a grain size of the powder and a surface area of the sintered body, but as long as the sintering is performed under the non-oxidizing atmosphere, an amount of oxygen contained in the sintered body does not exceed that of the molded body before sintering. Therefore, in the method of manufacturing the p-type thermoelectric substance according to the invention, a powder having the same composition as that of a finally obtained substance is prepared, casting the powder into a mold having a desired shape, and the thus obtained mold is sintered under the non-oxidizing atmosphere. The non-oxidizing atmosphere may be realized by an inert gas such as nitrogen and argon or by extremely high vacuum condition. It should be noted that the non-oxidizing atmosphere includes a reducing atmosphere. The thermoelectric converting substance according to the invention may contain Ge instead of Sn.

In samples 16–18, the relationship between the chemical compositions of various powders and the chemical compositions of the sintered substances manufactured from such powders are shown. From this, it can be understood that according to the invention, when a raw material powder has a larger amount of oxygen, the sintering may be performed under the reducing atmosphere such as a hydrogen gas. For instance, in samples 17 and 18, even if starting material powders contain oxygen by an amount which does not satisfy the condition of $2(x+y-3) \geq z$, it is possible to obtain the thermoelectric converting substances which satisfy the condition according to the invention by sintering the powders under the reducing atmosphere. This can be also true when Ge is used instead of Sn.

FIG. 1 is a graph showing results of the X-ray photoelectron spectroscopy (XPS) of the chemical bonding condition of Sn in various sintered substances shown in the Table 1.

Figure 2:
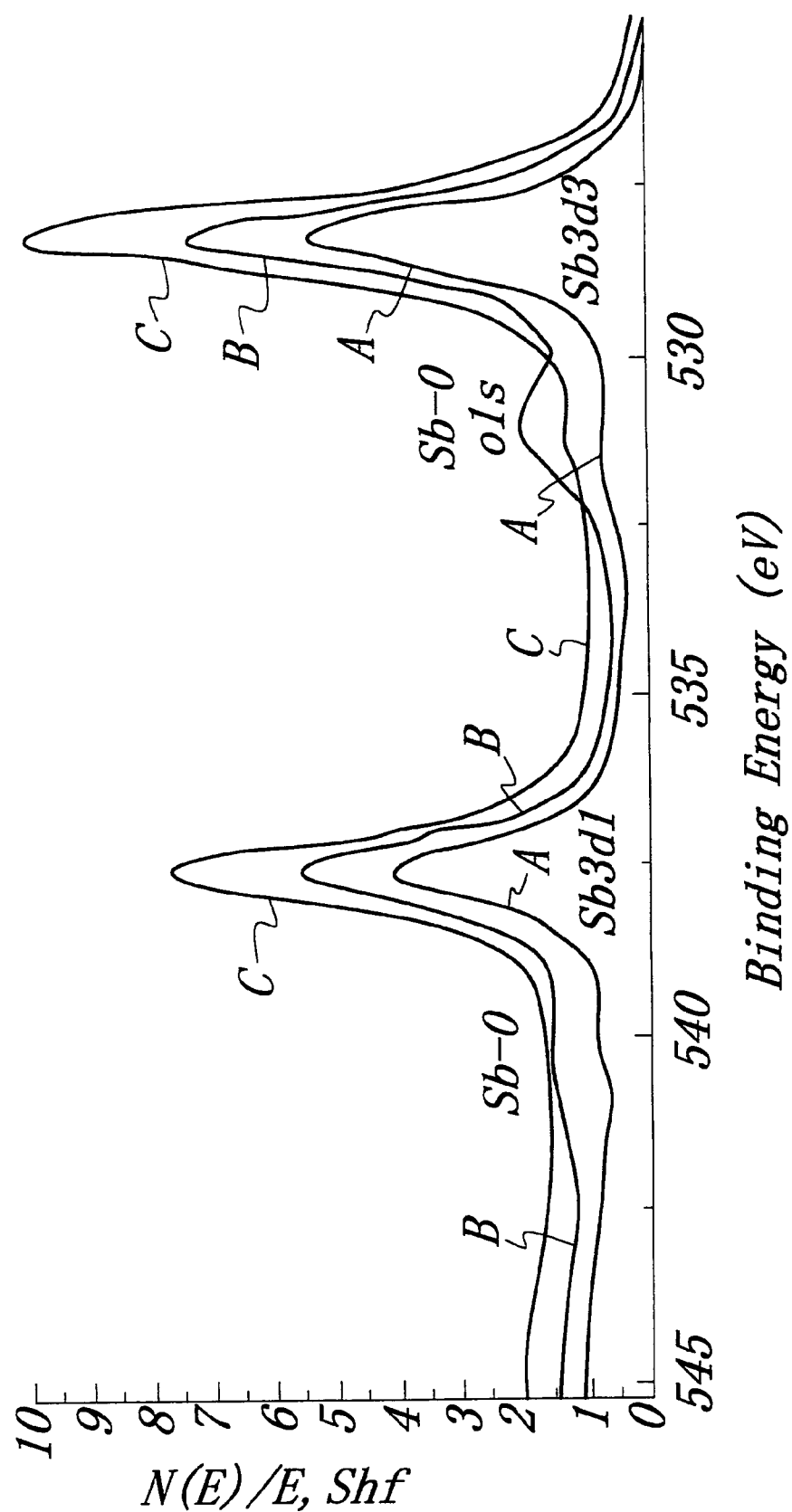
FIG. 2 is a graph of the X-ray photoelectron spectrum representing an existing condition of Sb in examples of the p-type thermoelectric converting substance according to the invention and in comparative examples.

FIG. 2 is a graph representing results of the X-ray photoelectron spectroscopy investigating the existing condition of Sn in various sintered substances of the Table 1.

In FIGS. 1 and 2, curves A, B and C show spectra showing the 3d condition of Sn of the samples 2, 8 and 16, respectively.

From FIG. 1, it can be understood that when oxygen is existent in the sintered body, Sn exists in the metal condition as well as in the oxidized condition. In the comparative sample 8, Sn in the metal condition has been completely lost. From FIG. 2, it can be seen that in the comparative sample 8, Sb is oxidized, but in the samples 2 and 16 according to the invention, no oxidization of Sb occurs.

From the above fact, it is clear that when oxygen is existent in the sintered body, Sn serving as dopant is first oxidized, and then Sb is oxidized. Therefore, when the sintered substance contains an excess amount of oxygen beyond the limit defined by the present invention, not only Sn but also Sb are oxidized and dopant could not enter into Sb defect sites, and thus the sintered substance shows n-type conductivity. In this case, it has been confirmed that Sn is changed into a dioxide. In this manner, if the sintered substance does not satisfy the condition according to the invention, it is difficult to obtain p-type thermoelectric converting substance. The p-type thermoelectric converting substance according to the invention is essentially consisting of a substance expressed by a chemical formula of $CoSb_xSn_y$ ($2.7<x<3.4$, $0<y<0.4$, $x+y>3$) and contains oxygen by a limited amount z of $2(x+y-3) \geq z$. In such a substance, although the oxidation of Sn occurs, the Sb is oxidized and there is no Sb defect site produced. Therefore, the substance reveals the p-type conductivity in a stable manner.

Furthermore, when Ge is used as dopant instead of Sn and the sintered body contains oxygen, there is produced germanium dioxide. In the p-type thermoelectric converting substance according to the invention it is mainly consisting of a substance expressed by a chemical formula of $CoSb_xGe_y$ ($2.7<x<3.4$, $0<y<0.4$, $x+y>3$) and it contains oxygen by a limited amount z of $2(x+y-3) \geq z$. Although Ge is oxidized, Sb is not oxidized and there is no defect site of Sb produced. Also in this substance, the p-type conductivity can be attained stably.

Figure 3:
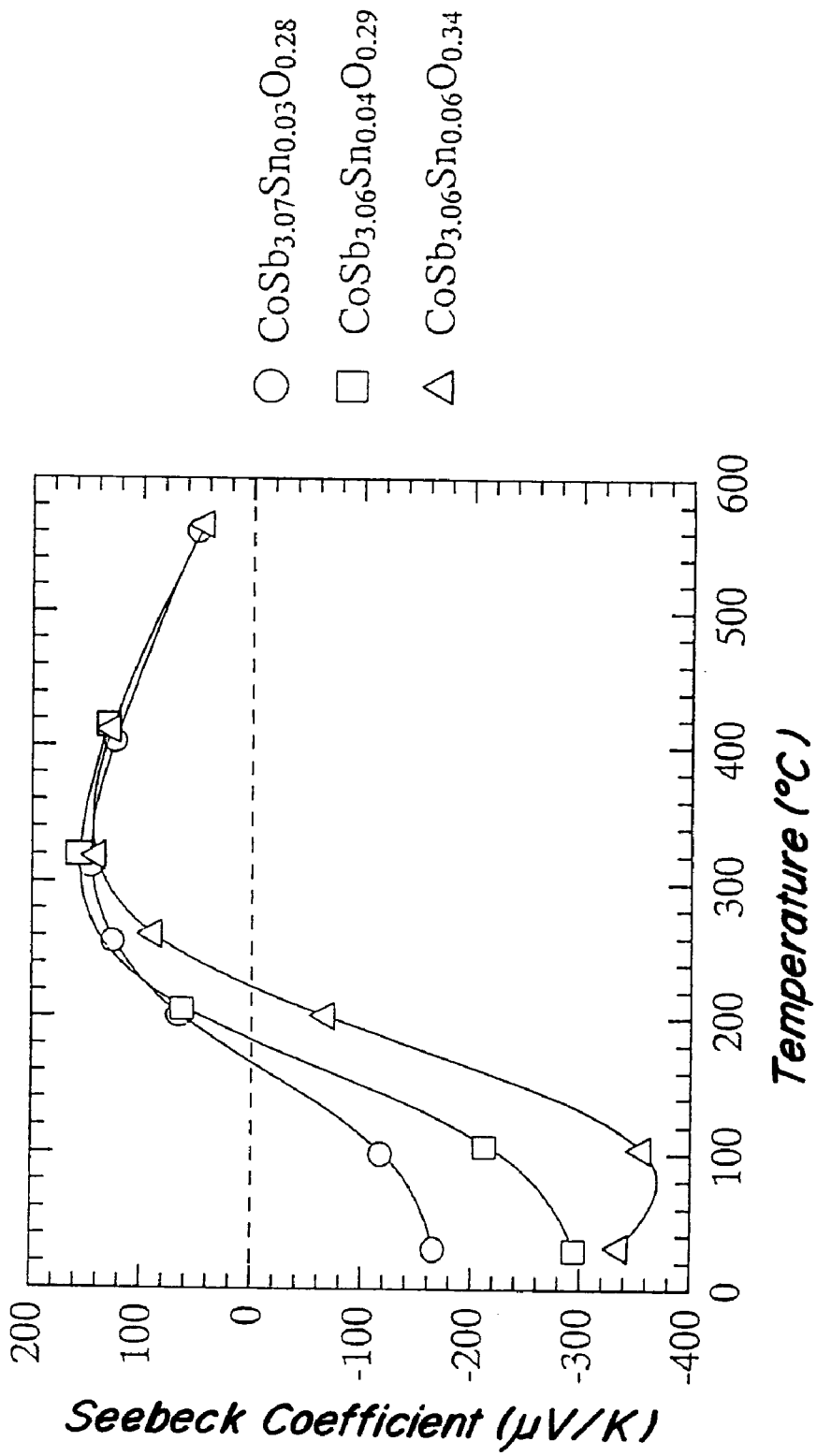
FIG. 3 is a graph denoting a temperature dependency of the Seebeck coefficient of comparative examples.
Figure 4:
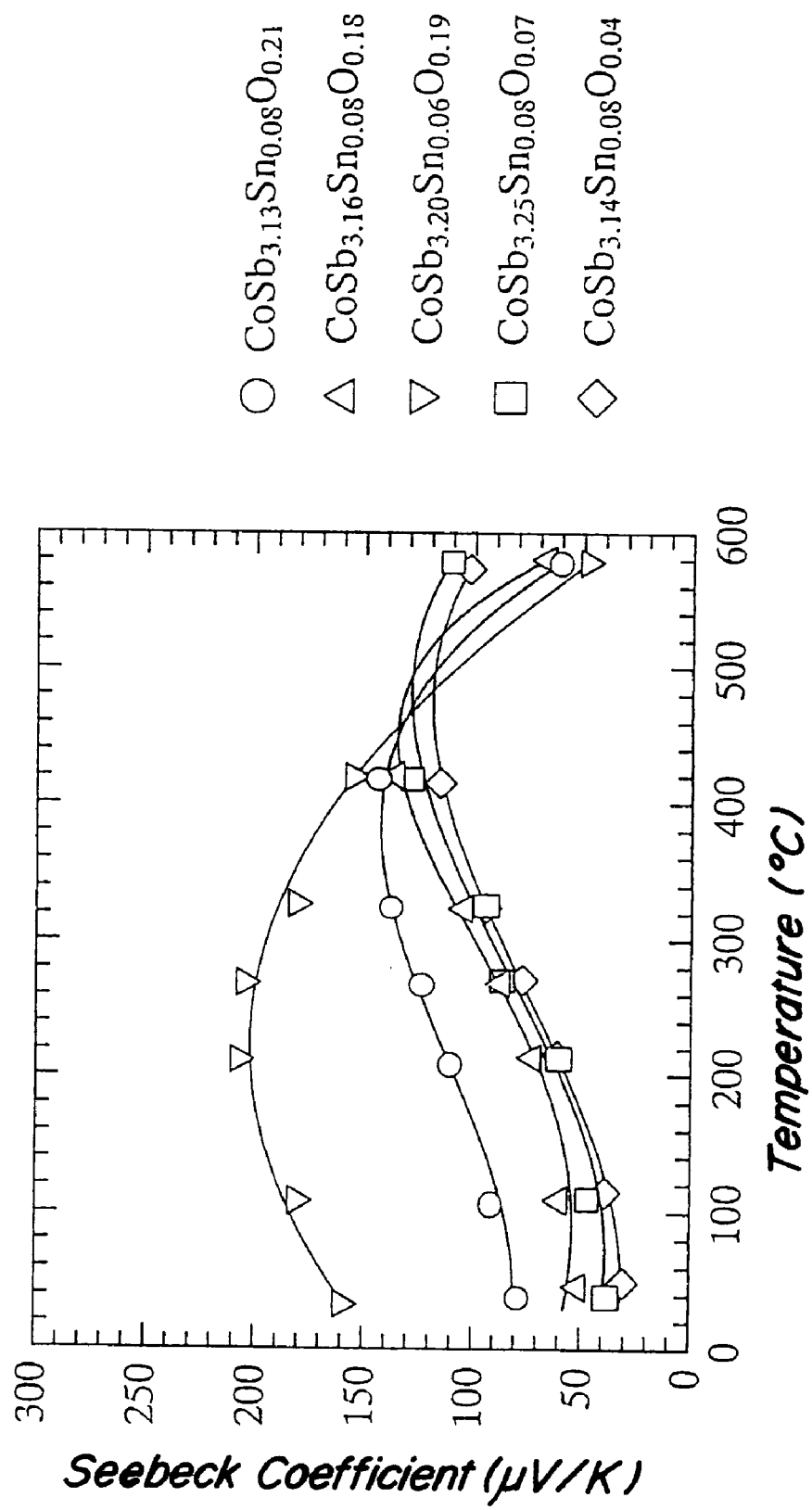
FIG. 4 is a graph showing a temperature dependency of the Seebeck coefficient of examples of the p-type thermoelectric converting substance according to the invention.

FIG. 3 shows the temperature dependency of the Seebeck coefficient representing the thermoelectric conversion efficiency of several comparative samples. FIG. 4 illustrates the temperature dependency of the Seebeck coefficient of several samples according to the invention. In these drawings, chemical compositions and amounts of oxygen are denoted for respective curves. It should be noted that when the Seebeck coefficient is positive, a substance shows the p-conductivity type, but it is negative, a substance is of the n-conductivity type.

From FIGS. 3 and 4, it can be understood that in the comparative samples, the conductivity type is inverted in response to the temperature, but the substance according to the invention reveals the p-conductivity type stably over a whole measuring temperature range, and has a large Seebeck coefficient.

It has been found that the above mentioned inversion of the conductivity type occurs also in comparative samples containing Ge instead of Sn as a dopant for controlling the conductivity type.

Figure 5:
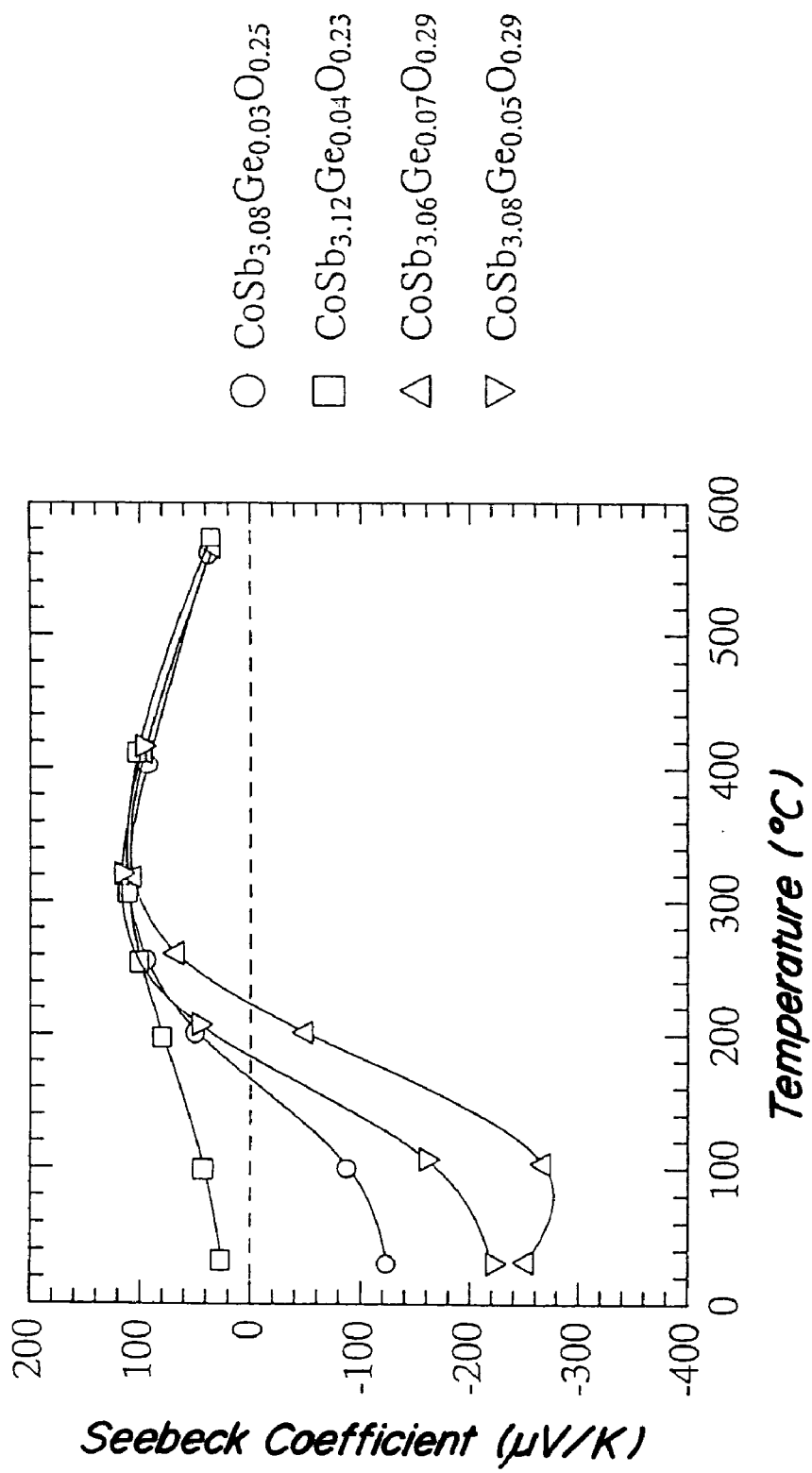
FIG. 5 is a graph representing a temperature dependency of the Seebeck coefficient of comparative examples and examples according to the invention.

FIG. 5 shows the temperature dependency of the Seebeck coefficient of a comparative example and an embodiment of the invention in which Ge is used as a dopant. A curve denoted by a square represents the temperature dependency of the embodiment according to the invention, and the remaining curves show the temperature dependency of the comparative example. From the graphs shown in FIG. 5, it can be seen that the sintered body according to the invention reveals the p-type conductivity stably over the whole temperature range, but the conductivity type of the comparative example is inverted depending upon the temperature.

From the above analysis, in the substance according to the invention in which an amount of oxygen is limited, Sn or Ge serving as the dopant for controlling the conductivity is existent in the metal condition and therefore the substance shows the p-type conductivity stable over a wide temperature range. Even if the metal Sn or Ge does not exist, because there will be no defect site of Sb existing the substance will show the p-type conductivity stable over a wide temperature range.

Moreover, according to the invention, it has been found that when an amount of oxygen in the sintered body is limited not to be larger than 0.1 mole per unit mole of cobalt, the p-conductivity type substance has an excellent property.

Figure 6:
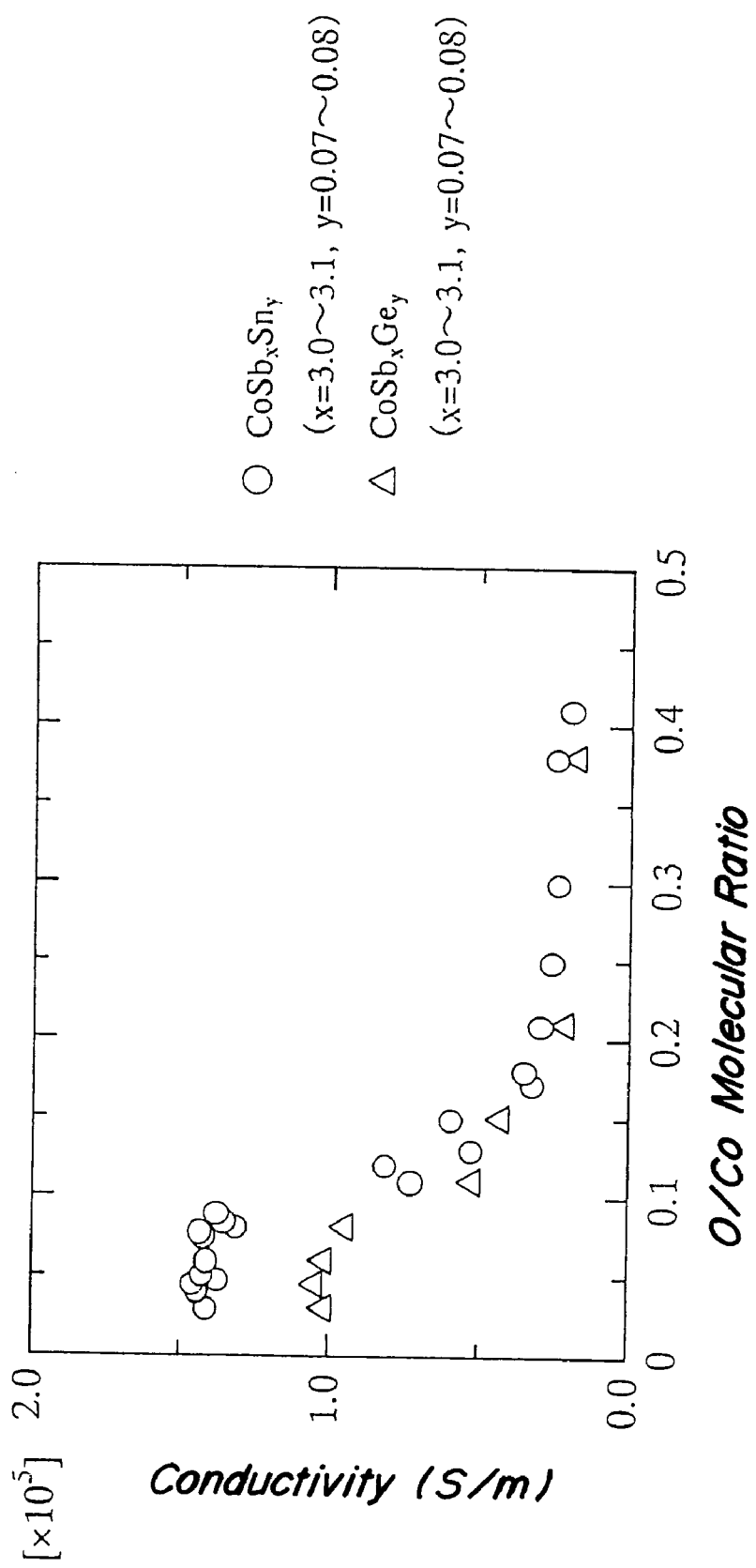
FIG. 6 is a graph showing a relationship between the O/Co molecular ratio and the electrical conductivity.

FIG. 6 shows a relationship between a molecular ratio of O/Co and the electrical conductivity. Wen a molecular ratio of O/Co is smaller than 0.1, the electrical conductivity is abruptly increased. This is due to the fact that the doping efficiency is increased in accordance with an increase in the solid solubility of Sn or Ge into the host body of $CoSb_3$, and that an amount of oxide of Sn or Ge is decreased, said oxide affecting the electrical conductivity.

In order to obtain the sintered body having a molecular ratio O/Co not larger than 0.1, it is desired to perform the sintering under the reducing atmosphere. As shown in the table 1, the sintering under the reducing atmosphere can easily reduce the molecular ratio O/Co not larger than 0.1 in regardless of an mount of oxygen contained in the raw material.

As explained above, in the p-conductivity type thermoelectric converting substance according to the invention, by limiting an amount of oxygen with respect to Sb and Sn or Sb and Ge, the substance can reveal the p-conductivity type stably over a wide temperature range, and by limiting an amount of oxygen with respect to Co, the thermoelectric property, particularly the electric conductivity can be improved.

Furthermore, in the method according to the invention, it is possible to manufacture the thermoelectric converting substance which reveals the p-conductivity type over a wide temperature range and has the superior thermoelectric converting property by means of the widely used sintering process. Therefore, the p-conductivity type thermoelectric converting substance having the higher performance can be manufactured efficiently at a lower cost. In this manner, the industrial benefit of the method according to the invention is very large.

The basic structure of the substance according to the invention is of the cubic crystalline structure of $CoSb_3$, and thus p-type substance and n-type substance have the same crystalline structure. Therefore, when the thermoelectric converting module is formed by such substances, p-n junction can be formed easily by molding powder materials, because these substances can be recognized as the same material in the thermal stability and thermal expansion. Further, these substances are chemically stable over a wide temperature range higher than 300° C., are scarcely degraded, and have good molding property and heat resistant property. Therefore, the thermoelectric converting module can be manufactured economically.

What is claimed is:

1. A thermoelectric converting substance used as a p-type semiconductor material in a thermoelectric converting module consisting essentially of a substance expressed by a chemical formula $CoSb_xSn_y$ wherein $2.7<x<3.4$, $0<y<0.4$, $x+y>3$, and containing oxygen in an amount z of $2(x+y-3) \geq z$.

2. A thermoelectric converting substance according to claim 1, wherein said amount of oxygen z is limited such that amount of the oxygen is not higher than 0.1 molecules per 1 molecule of Co.

3. A thermoelectric converting substance according to claim 1, wherein said substance is in the form of a sintered body.

4. A thermoelectric converting substance used as a p-type semiconductor material in a thermoelectric converting module consisting essentially of a substance expressed by a chemical formula $CoSb_xGe_y$ wherein $2.7<x<3.4$, $0<y<0.4$, $x+y>3$, and containing oxygen in an amount z of $2(x+y-3) \geq z$.

5. A thermoelectric converting substance according to claim 4, wherein said amount of the oxygen z is limited such that the amount of the oxygen is not higher than 0.1 molecules per 1 molecule of Co.

6. A thermoelectric converting substance according to claim 4, wherein said substance is in the form of a sintered body.

7. A method of manufacturing a p-type thermoelectric converting substance comprising the steps of:

preparing a raw material powder consisting essentially of a substance expressed by a chemical formula $CoSb_xSn_y$ wherein $2.7<x<3.4$, $0<y<0.4$, $x+y>3$, in which Sn serves as a dopant for controlling the conductivity type;

casting said raw material powder into a mold having a given shape; and sintering said mold under a reducing atmosphere wherein the amount z of oxygen contained in said sintered mold is not larger than $2(x+y-3)$.

8. A method according to claim 7, wherein said sintering is carried out under a hydrogen atmosphere.

9. A method according to claim 7, wherein said raw material powder is prepared by mixing given amounts of Co, Sb and Sn particles, melting the particles to obtain an alloy ingot, and grinding the alloy ingot into said raw material powder.

10. A method according to claim 7, wherein said alloy ingot is ground such that an average diameter of the raw material powder is smaller than 100 μm.

11. A method according to claim 7, wherein said sintering is carried out at a temperature in a range of 600–800° C.

12. A method of manufacturing a p-type thermoelectric converting substance comprising the steps of:

preparing a raw material powder consisting essentially of a substance expressed by a chemical formula $CoSb_xGe_y$, wherein $2.7<x<3.4$, $0<y<0.4$, $x+y>3$, in which Ge serves as a dopant for controlling the conductivity type;

casting said raw material powder into a mold having a given shape; and sintering said mold under a reducing atmosphere.

13. A method according to claim 12, wherein said sintering is carried out under a hydrogen atmosphere.

14. A method of manufacturing a p-type thermoelectric converting substance comprising the steps of:

preparing a raw material powder consisting essentially of a substance expressed by a chemical formula $CoSb_xSn_y$, wherein $2.7<x<3.4$, $0<y<0.4$, $x+y>3$ and containing oxygen in an amount z of $2(x+y-3) \geq z$, Sn serving as a dopant for controlling the conductivity;

casting said raw material powder into a mold having a given shape; and sintering said mold under a non-oxidizing atmosphere.

15. A method according to claim 14, wherein said sintering is carried out under an inert gas atmosphere.

16. A method according to claim 14, wherein said sintering is carried out under a hydrogen atmosphere.

17. A method according to claim 14, wherein said sintering is carried out in high vacuum.

18. A method according to claim 14, wherein said raw material powder is prepared by mixing given amounts of Co, Sb and Sn particles, melting the particles to obtain an alloy ingot, and grinding the alloy ingot into said raw material powder.

19. A method according to claim 14, wherein said alloy ingot is ground such that an average diameter of the raw material powder is smaller than 100 μm.

20. A method according to claim 14, wherein said sintering is carried out at a temperature in a range of 600–800° C.

21. A method of manufacturing a p-type thermoelectric converting substance comprising the steps of:

preparing a raw material powder consisting essentially of a substance expressed by a chemical formula $CoSb_xGe_y$, wherein $2.7<x<3.4$, $0<y<0.4$, $x+y>3$ and containing oxygen in an amount z of $2(x+y-3) \geq z$, Ge serving as a dopant for controlling the conductivity;

casting said raw material powder into a mold having a given shape; and sintering said mold under a non-oxidizing atmosphere.

22. A method according to claim 21, wherein said sintering is carried out under an inert gas atmosphere.

23. A method according to claim 21, wherein said sintering is carried out under a hydrogen atmosphere.

24. A method according to claim 21, wherein said sintering is carried out in high vacuum.

25. A method according to claim 21, wherein said raw material powder is prepared by mixing given amounts of Co, Sb and Sn particles, melting the particles to obtain an alloy ingot, and grinding the alloy ingot into said raw material powder.

26. A method according to claim 21, wherein said alloy ingot is ground such that an average diameter of the raw material powder is smaller than 100 μm.

27. A method according to claim 21, wherein said sintering is carried out at a temperature in a range of 600–800° C.

* * * * *